US007184277B2

(12) United States Patent
Beirne

(10) Patent No.: US 7,184,277 B2
(45) Date of Patent: Feb. 27, 2007

(54) GAMING MACHINE WITH UNIVERSAL PC BOARD MOUNTING SYSTEM

(75) Inventor: John J. Beirne, Chicago, IL (US)

(73) Assignee: WMS Gaming Inc., Waukegan, IL (US)

( * ) Notice: Subject to any disclaimer, the term of this patent is extended or adjusted under 35 U.S.C. 154(b) by 729 days.

(21) Appl. No.: 10/293,456

(22) Filed: Nov. 13, 2002

(65) Prior Publication Data

US 2004/0092317 A1 May 13, 2004

(51) Int. Cl.
*A63F 9/24* (2006.01)
*H05K 7/02* (2006.01)

(52) U.S. Cl. ........................ 361/807; 361/809; 463/46

(58) Field of Classification Search ........ 361/807–810, 361/742, 758, 770, 804; 174/52.1, 520; 463/46
See application file for complete search history.

(56) References Cited

U.S. PATENT DOCUMENTS

| | | | | |
|---|---|---|---|---|
| 5,691,504 | A * | 11/1997 | Sands et al. | 174/372 |
| 5,978,232 | A * | 11/1999 | Jo | 361/796 |
| 6,479,746 | B2 * | 11/2002 | Hussaini | 174/50 |
| 6,533,659 | B2 * | 3/2003 | Seymour et al. | 463/16 |
| 6,741,477 | B2 * | 5/2004 | Sivertsen | 361/752 |
| 2002/0006828 | A1 * | 1/2002 | Gerding | 463/46 |
| 2006/0189387 | A1 * | 8/2006 | Rigsby et al. | 463/37 |

* cited by examiner

*Primary Examiner*—Elvin Enad
*Assistant Examiner*—Dameon E. Levi
(74) *Attorney, Agent, or Firm*—Jenkens & Gilchrist

(57) ABSTRACT

A printed circuit board mounting system for a gaming machine comprises a universal mounting plate and adaptive mounting hardware. The universal mounting plate supports a printed circuit board with any mounting hole pattern, and includes a fixed pattern of mounting locations. The adaptive mounting hardware links the printed circuit board's mounting hole pattern to the universal mounting plate's fixed pattern of mounting locations.

27 Claims, 5 Drawing Sheets

GAMING MACHINE WITH UNIVERSAL PC BOARD MOUNTING SYSTEM

FIELD OF THE INVENTION

The present invention relates generally to gaming machines and, more particularly, to a gaming machine with a mounting system for mounting printed circuit (PC) boards with different mounting hole patterns to a universal mounting plate.

BACKGROUND OF THE INVENTION

A gaming machine is operable to conduct a wagering game such as slots, poker, keno, bingo, or blackjack. In response to a wager for purchasing a play of the game, the machine generates a random (or pseudo-random) event and provides an award to a player for a winning outcome of the random event. Occasionally, the random event may trigger a bonus game involving lively animations, display illuminations, special effects, and/or player interaction. Game outcomes are presented to the player on one or more displays, which depict the outcomes in a form that can be understood by the player.

A gaming machine typically includes an outer cabinet that houses a main controller, several peripheral devices, and wiring harnesses to electrically connect the peripheral devices to the main controller. The main controller may, for example, include one or more printed circuit boards carrying one or more processors, a plurality of logic devices, and one or more memory devices for storing executable program code and game data. The memory devices for storing executable code may, for example, include EPROMS, hard disk drives, Compact FLASH cards, CD-ROMs, DVDs, and Smart Media cards. The stored executable code provides two basic functions: (1) an operating system for controlling the gaming machine and handling communications between the gaming machine and an external network, and (2) game code for conducting a game on the gaming machine.

Different printed circuit boards may serve different functions. For example, a main game control board may control one or more games played on the machine. A slot machine interface board (SMIB) may handle external communications between the gaming machine and an external network. A game interface board may handle internal communications and transmission of power between the main control board and internal peripheral devices. A backplane board may provide connectors for connection to the peripheral devices of the gaming machine.

To mount the aforementioned printed circuit boards within the cabinet of the gaming machine, the printed circuit boards may first be mounted to one or more mounting plates which, in turn, are mounted within the cabinet. If a variety of sizes and shapes of printed circuit boards can perform a common task, a unique mounting plate would be needed for the custom mounting hole pattern of each printed circuit board. Unfortunately, if the printed circuit board is replaced in the field or factory with a different board having a different mounting hole pattern and hole sizes, the mounting plate may also need to be replaced with a different customized plate capable of accommodating the new board. As networks and network interfaces are upgraded, for example, it is particularly common to replace the SMIB board with a different SMIB board that has a different custom mounting hole pattern requiring a different mounting plate. This adds to the cost and labor involved in replacing the printed circuit board. A need therefore exists for a mounting system that facilitates installation of a printed circuit board with any mounting hole pattern into a common location in a gaming machine.

SUMMARY OF THE INVENTION

Accordingly, a printed circuit board mounting system for a gaming machine comprises a universal mounting plate and adaptive mounting hardware. The universal mounting plate supports a printed circuit board with any mounting hole pattern, and includes a fixed pattern of mounting locations. The adaptive mounting hardware links the printed circuit board's mounting hole pattern to the universal mounting plate's fixed pattern of mounting locations. Because a printed circuit board with any mounting hole pattern can be mounted to the universal mounting plate, there is no need for any advanced design work, special part ordering, or even knowledge of the dimensions of the printed circuit board's mounting hole pattern prior to installing the printed circuit board. A method of mounting the printed circuit board to the universal mounting plate is also disclosed.

BRIEF DESCRIPTION OF THE DRAWINGS

The foregoing and other advantages of the invention will become apparent upon reading the following detailed description and upon reference to the drawings.

Figure 1:
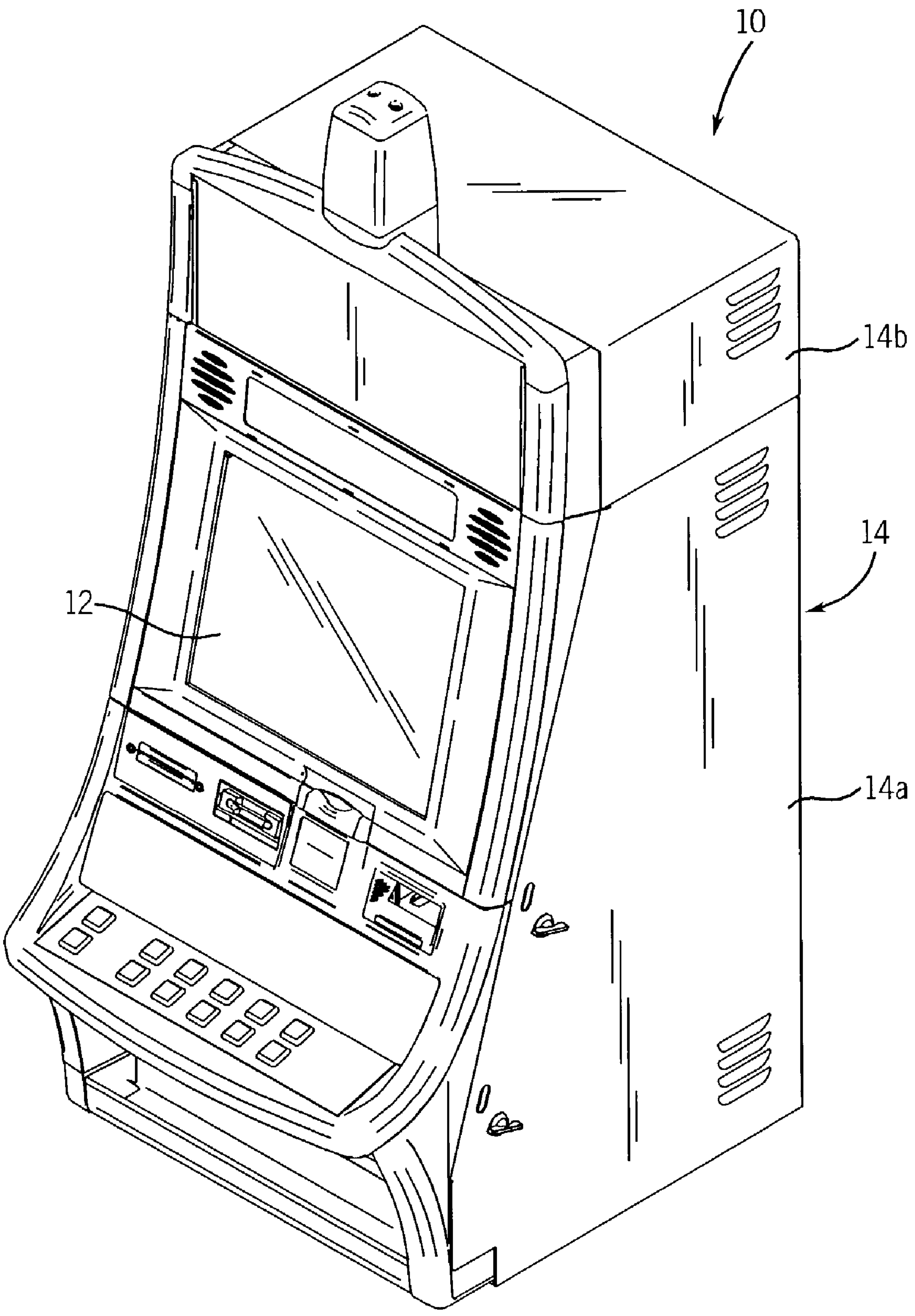
FIG. 1 is an isometric view of a gaming machine containing a universal printed circuit board mounting system embodying the present invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

Turning now to the drawings, FIG. 1 depicts a gaming machine 10 operable to conduct a wagering game such as slots, poker, keno, bingo, or blackjack. In response to a wager for purchasing a play of the game, the machine generates a random (or pseudo-random) event using a random number generator (RNG) and provides an award to a player for a winning outcome of the random event. Occasionally, the random event may trigger a bonus game involving lively animations, display illuminations, special effects, and/or player interaction. Game outcomes are presented to the player on at least one display 12, which depicts the outcomes in a form that can be understood by the player. The gaming machine 10 includes an outer cabinet 14 that houses a main controller, several peripheral devices, and wiring harnesses to electrically connect the peripheral devices to the main controller. The cabinet 14 includes a lower section 14*a* and a top box 14*b* mounted to the lower section 14*a*.

The main controller may, for example, include one or more printed circuit boards carrying one or more processors, a plurality of logic devices, and one or more memory devices for storing executable program code (software) and game data. The memory devices for storing executable code may, for example, include EPROMs, hard disk drives, Compact FLASH cards, CD-ROMs, DVDs, and Smart Media cards. The stored executable code provides two basic functions: (1) an operating system for controlling the gaming machine and handling communications between the gaming machine and an external network, and (2) game code for conducting a game on the gaming machine. In operation, the main controller loads executable code and associated game data into system memory and executes the code out of system memory.

Different printed circuit boards may serve different functions. For example, a main game control board may control one or more games played on the machine. A slot machine interface board (SMIB) may handle external communications between the gaming machine and an external network. A game interface board may handle internal communications and transmission of power between the main control board and internal peripheral devices. A backplane board may provide connectors for connection to the peripheral devices of the gaming machine.

Figure 2:
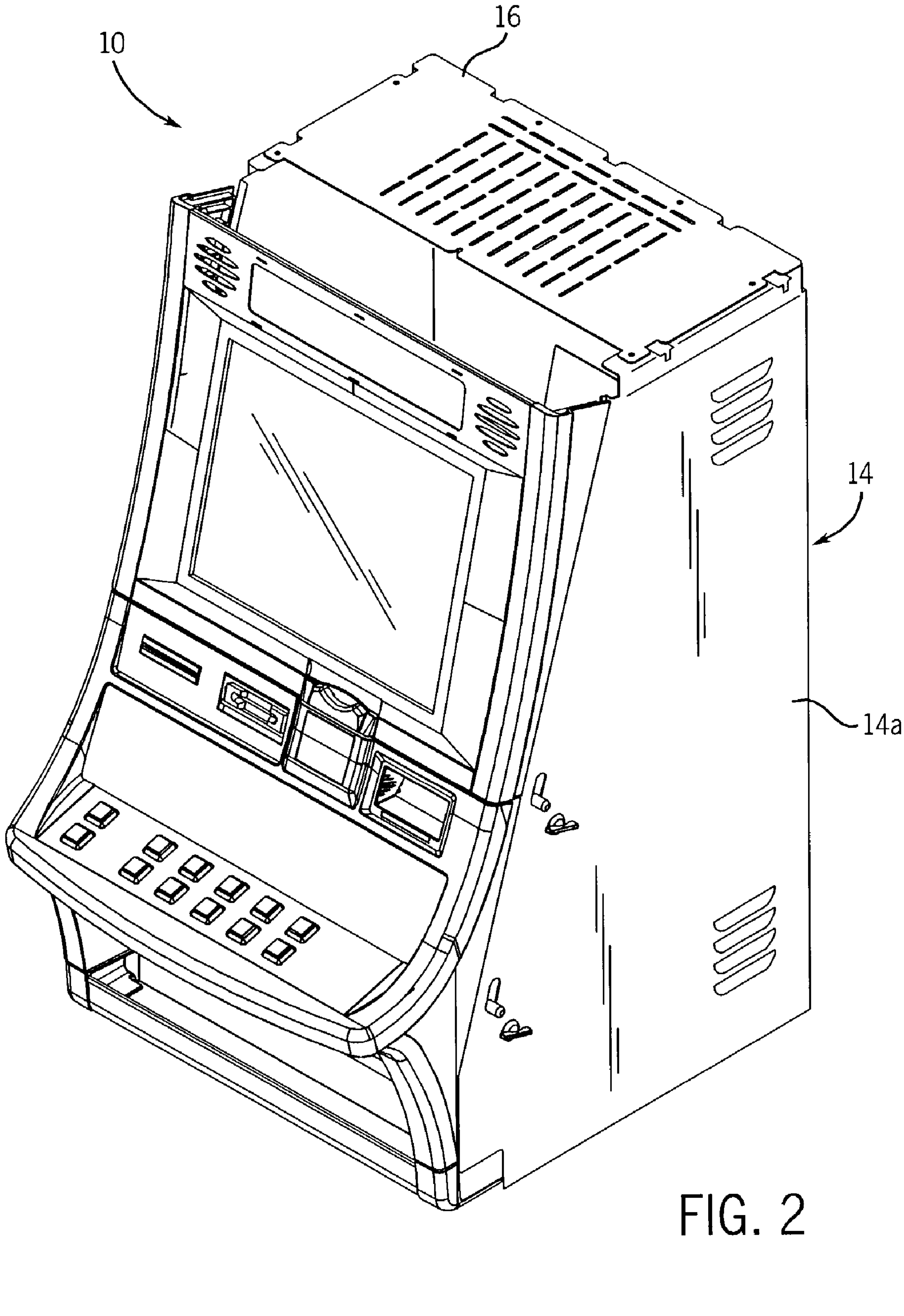
FIG. 2 is an isometric view of the gaming machine with its top box removed to reveal a mounting plate of the mounting system.

FIG. 2 depicts the gaming machine 10 with the top box 14*a* (see FIG. 1) removed. The printed circuit boards may be mounted within the cabinet 14 via associated mounting plates. A SMIB board, for example, may be mounted to a universal mounting plate 16 which, in turn, is fastened to an upper end of the lower cabinet section 14*a*. Other printed circuit boards may be mounted to other universal mounting plates elsewhere within the cabinet 14 in a similar manner. Although the mounting system of the present invention is described below in the context of the SMIB board, the mounting system may be utilized in connection with other printed circuit boards of the gaming machine, such as the main game control board, the game interface board, and the backplane board.

Figure 3A:
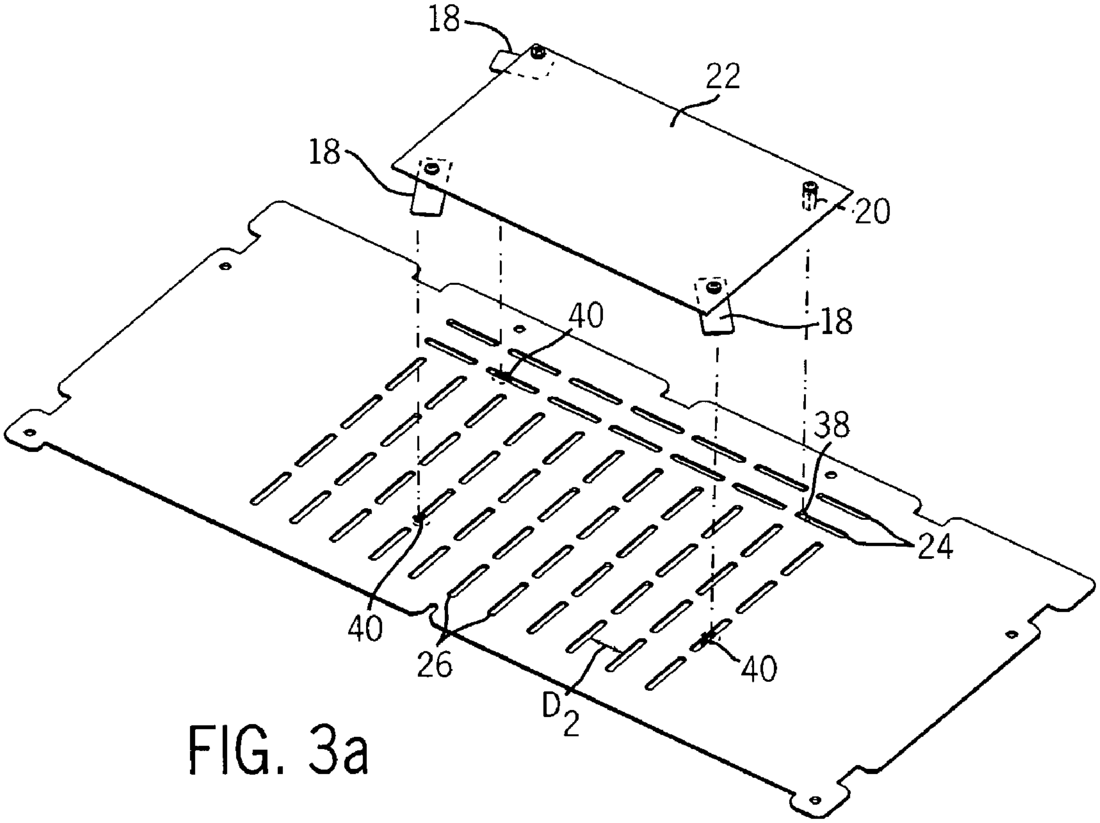
FIG. 3*a* is an exploded isometric view of the mounting system.
Figure 3B:
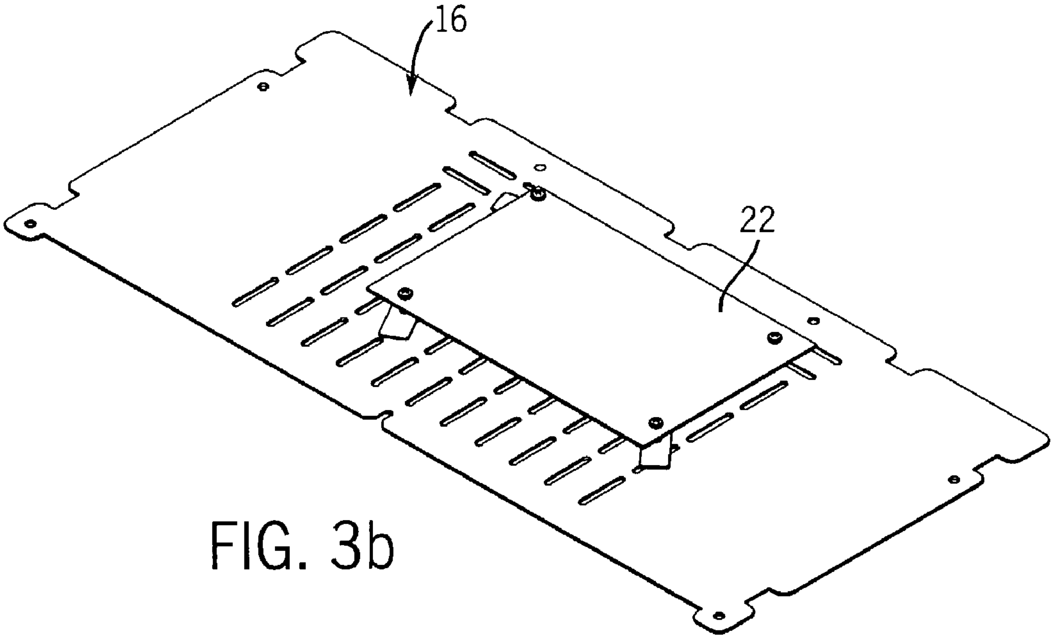
FIG. 3*b* is an unexploded isometric view of the mounting system.

Referring to FIGS. 3*a* and 3*b*, a printed circuit board mounting system for the gaming machine comprises the universal mounting plate 16 and adaptive mounting hardware. The mounting hardware includes three identical mounting elements 18 and one different mounting element 20. The mounting hardware mounts a printed circuit board 22 to the mounting plate 16. As best shown in FIG. 3*a*, the mounting plate 16 forms a pattern of slots. The pattern of slots includes first and second pluralities of slots oriented generally perpendicular to each other. The first plurality of slots 24 include one or more rows of slots. The second plurality of slots 26 include a plurality of columns of slots. Although the number of rows and columns are illustrated to be two and eleven respectively, the number of rows and columns may be varied so long as the mounting hardware is still capable of adapting the mounting hole pattern of the printed circuit board 22 to the pattern of slots formed in the mounting plate 16.

Figure 4B:
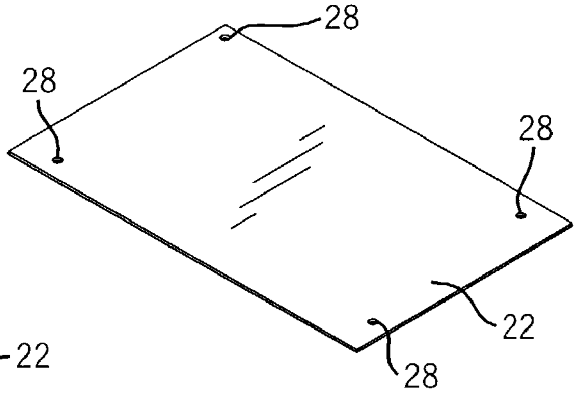
FIG. 4*b* is an isometric view of the printed circuit board.
Figure 4A:
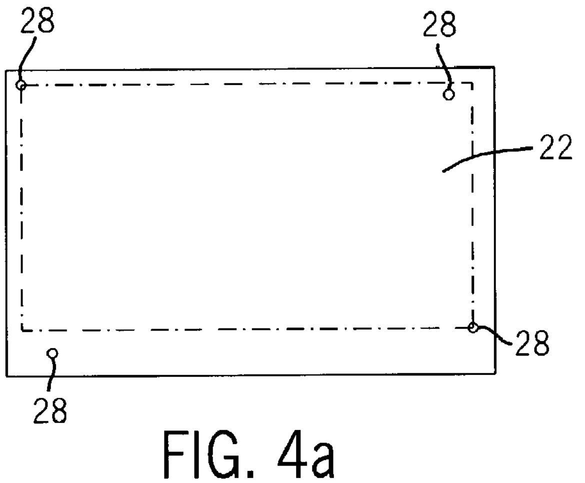
FIG. 4*a* is a top view of a printed circuit board with a mounting hole pattern.

Referring to FIGS. 4*a* and 4*b*, the printed circuit board 22 has a mounting hole pattern that may be irregular, e.g., non-rectangular, as illustrated. The mounting hole pattern includes a plurality of mounting holes 28.

Figure 5A:
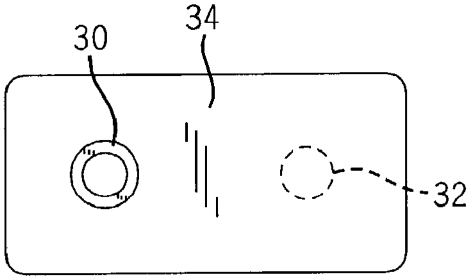
FIG. 5*a* is a top view of a mounting element for mounting the printed circuit board to the mounting plate.
Figure 5B:
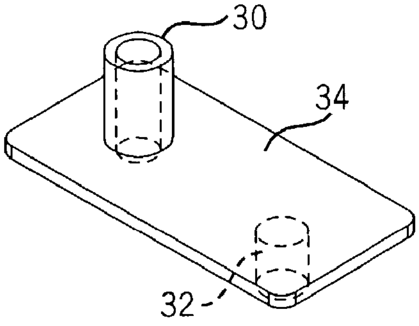
FIG. 5*b* is an isometric view of the mounting element.
Figure 5C:
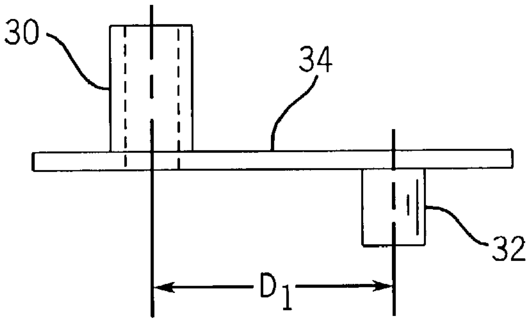
FIG. 5*c* is a side view of the mounting element.
Figure 5D:
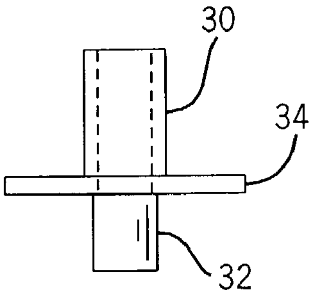
FIG. 5*d* is an end view of the mounting element.

Referring to FIGS. 5*a*, 5*b*, 5*c*, and 5*d*, each mounting element 18 includes a threaded standoff 30, a threaded stud 32, and a flat plate 34. The threaded standoff 30 and the threaded stud 32 extend from opposite sides of the flat plate 34. As best shown in FIG. 5*c*, the threaded standoff 30 and the threaded stud 32 are horizontally offset from each other (i.e., not coaxial) by a distance $D_1$ that is greater than one-half of a center-to-center distance $D_2$ between adjacent slots 26 in FIG. 3*a*.

Figure 6:
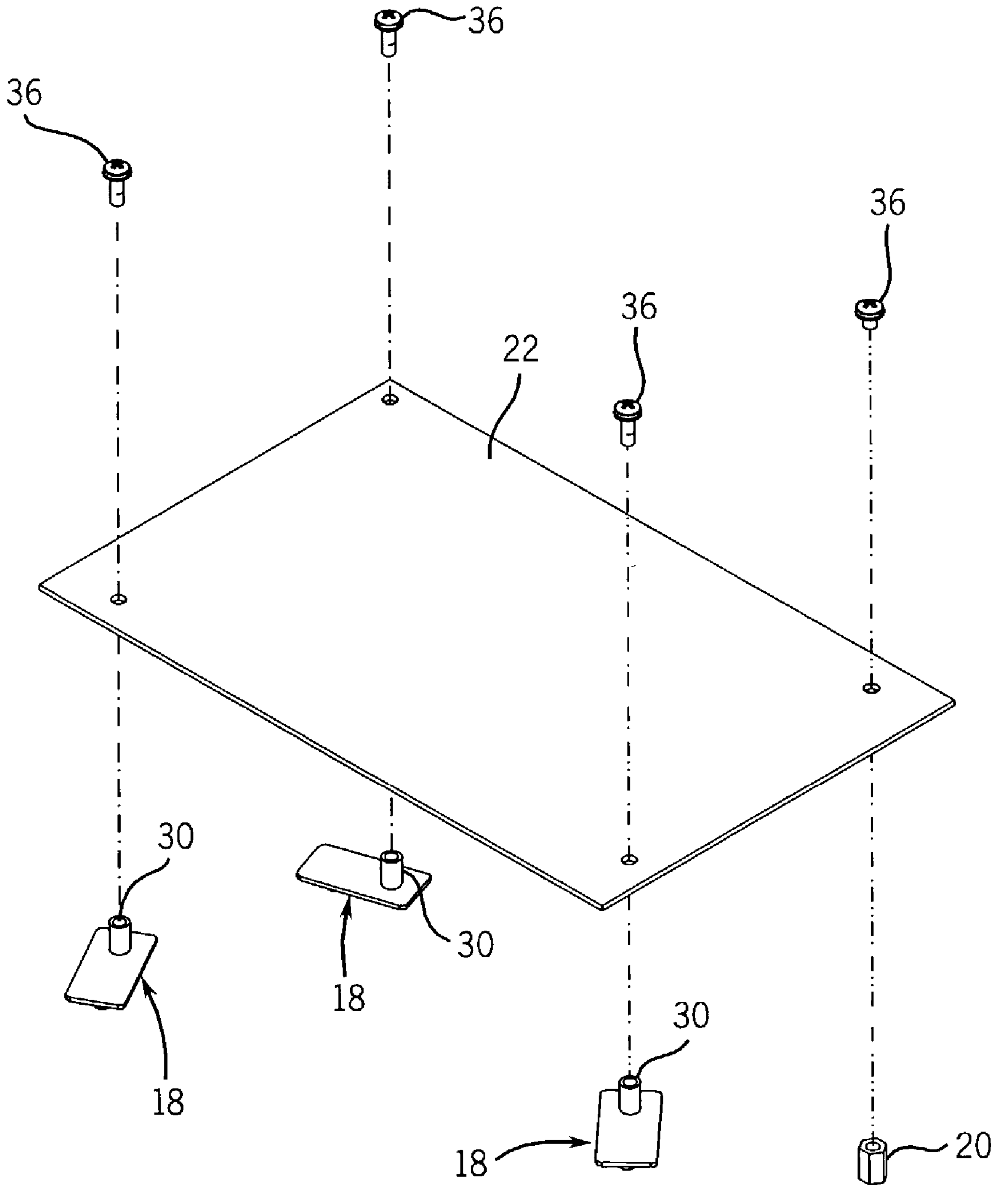
FIG. 6 is an exploded isometric view showing the manner in which mounting elements are fastened to the printed circuit board.

Referring to FIG. 6, the three mounting elements 18 and the mounting element 20 are fastened to the bottom of the printed circuit board 22 by respective screws 36. Specifically, the screws 36 are inserted through the respective holes 28 in the printed circuit board 22 and threaded to the standoffs 30 of the respective mounting elements 18 and to the mounting element 20. The mounting element 20 is a threaded hexagon spacer. Each mounting element 18 can rotate about its respective screw 36.

Referring back to FIG. 3*a*, the printed circuit board 22 with mounting hardware thereon can then be placed on the universal mounting plate 16. The hexagon spacer 20 is first fastened by a screw 38 to a slot in one of the rows 24. The threaded studs 32 (see FIGS. 5*a*, 5*b*, 5*c*, and 5*d*) of the respective mounting elements 18 are then rotated until they each slip into a respective slot in one of the rows 24 or columns 26. After each of the threaded studs 32 slip into a respective slot, the threaded studs 32 are then fastened by respective nuts 40. To aid in locating the three mounting elements 18, the hexagon spacer 20 can be slid along its slot. The mounted printed circuit board 22 is shown in FIG. 3*b*.

As long as the printed circuit board 22 is smaller than the slotted area of the universal mounting plate 16, any printed circuit board can be mounted to the mounting plate 16 regardless of where the board's mounting holes 28 are located. The mounting hardware is sufficiently versatile to link holes 28 of the board's mounting hole pattern to slots 24, 26 of the mounting plate's pattern of slots, thereby adapting the mounting hole pattern of the printed circuit board 22 to the pattern of slots formed in the universal mounting plate 16.

While the present invention has been described with reference to one or more particular embodiments, those skilled in the art will recognize that many changes may be made thereto without departing from the spirit and scope of the present invention. For example, the adaptive mounting hardware may be modified such that the standoffs 30 and corresponding screws 36 (see FIG. 6) are replaced with different mounting mechanisms such as snap-on mounting posts. Each of these embodiments and obvious variations thereof is contemplated as falling within the spirit and scope of the claimed invention, which is set forth in the following claims:

What is claimed is:

1. A gaming machine for conducting a wagering game, comprising:

a gaming cabinet;

a wager input device for receiving a wager input to play the wagering game;

a display mounted to the gaming cabinet for displaying a randomly selected outcome of the wagering game;

a controller coupled to the display and to the wager input device and programmed to select a randomly selected outcome of the wagering game;

a universal mounting plate mounted within the gaming cabinet for supporting printed circuit boards with different mounting hole patterns, the mounting plate having a pattern of slots; and mounting hardware for mounting any one of the printed circuit boards to the universal mounting plate.

2. The gaming machine of claim 1, wherein the mounting hardware adapts the different mounting hole patterns to a pattern of slots formed in the mounting plate.

3. The gaming machine of claim 2, wherein the mounting hardware connects to the mounting plate at a plurality of locations within the slots, the plurality of locations varying with the different mounting hole patterns.

4. The gaming machine of claim 2, wherein the mounting hardware connects to the mounting plate at a plurality of locations, the plurality of locations varying with the different mounting hole patterns.

5. The gaming machine of claim 1, wherein each mounting hole pattern is irregular.

6. The gaming machine of claim 1, wherein the mounting hardware is movably connected to the printed circuit board prior to mounting any one of the printed circuit boards to the universal mounting plate.

7. The gaming machine of claim 6, wherein the mounting hardware is rotatably connected to the printed circuit board prior to mounting any one of the printed circuit boards to the universal mounting plate.

8. The gaming machine of claim 1, wherein the mounting hole pattern includes a plurality holes, and wherein the mounting hardware includes a plurality of mounting elements movably connected to the printed circuit board at the respective holes prior to mounting any one of the printed circuit boards to the universal mounting plate.

9. The gaming machine of claim 8, wherein the plurality of mounting elements are rotatably connected to the printed circuit board at the respective holes prior to mounting any one of the printed circuit boards to the universal mounting plate.

10. The gaming machine of claim 8, wherein the plurality of mounting elements connect to the mounting plate at a plurality of locations within the slots, the plurality of locations varying with the different mounting hole patterns.

11. The gaming machine of claim 1, wherein the mounting hardware includes a plurality of mounting elements, each mounting element including a threaded standoff, a threaded stud, and a flat plate, the threaded standoff and the threaded stud extending from opposite sides of the flat plate, the threaded stud being exteriorly threaded.

12. The gaming machine of claim 11, wherein the threaded standoff and the threaded stud are offset from each other.

13. The gaming machine of claim 12, wherein the plurality of mounting elements connect to the mounting plate at a plurality of locations within the slots, wherein the threaded standoff and the threaded stud are offset from each other by a distance greater than one-half of a shortest distance between adjacent ones of the slots.

14. The gaming machine of claim 11, wherein the threaded standoff of each mounting element is connected to a bottom of any one of the printed circuit boards by a respective fastener, each mounting element being rotatable about the respective fastener.

15. The gaming machine of claim 14, wherein the threaded stud of each mounting element is secured to the universal mounting plate at a respective slot formed in the universal mounting plate.

16. The gaming machine of claim 2, wherein the pattern of slots includes first and second pluralities of slots oriented generally perpendicular to each other.

17. The gaming machine of claim 16, wherein the first plurality of slots include one or more rows of slots, and wherein the second plurality of slots include a plurality of columns of slots.

18. A gaming machine for playing a wagering game, comprising:

a gaming cabinet;

a display mounted within the gaming cabinet for displaying a randomly selected game outcome of the wagering game, the randomly selected game outcome being selected in response to receiving a wager input from a player;

a controller mounted within the gaming cabinet and causing the display to display the randomly selected outcome;

a universal mounting plate for supporting a printed circuit board with any mounting hole pattern, the universal mounting plate including a pattern of mounting locations; and mounting hardware for adapting the mounting hole pattern to the pattern of mounting locations and mounting the printed circuit board to the universal mounting plate.

19. The gaming machine of claim 18, wherein the pattern of mounting locations includes a pattern of slots, the mounting hardware adapting the mounting hole pattern to the pattern of slots.

20. The gaming machine of claim 19, wherein the mounting hardware links holes of the mounting hole pattern to slots of the pattern of slots.

21. The gaming machine of claim 18, wherein the mounting hardware links holes of the mounting hole pattern to mounting locations of the pattern of mounting locations.

22. The gaming machine of claim 18, wherein the mounting hardware includes a plurality of mounting elements, each mounting element linking a respective hole of the mounting hole pattern to a respective mounting location of the pattern of mounting locations.

23. A method of mounting a printed circuit board to a universal mounting plate mounted within a gaming cabinet of a gaming machine for conducting a wagering game, the printed circuit board having any mounting hole pattern, the universal mounting plate including a pattern of adjustable slot mounting locations, the method comprising:

providing mounting hardware that adapts the mounting hole pattern to the pattern of mounting locations, the mounting hardware being adjustable within one or more of the mounting locations; and mounting, with the mounting hardware, the printed circuit board to the universal mounting plate.

24. The method of claim 23, wherein the pattern of mounting locations includes a pattern of slots, and wherein the mounting hardware adapts the mounting hole pattern to the pattern of slots.

25. The method of claim 24, wherein the mounting step mounts the mounting hardware between holes of the mounting hole pattern and slots of the pattern of slots.

26. The method of claim 23, wherein the mounting step mounts the mounting hardware between holes of the mounting hole pattern and mounting locations of the pattern of mounting locations.

27. The method of claim 23, wherein the mounting hardware includes a plurality of mounting elements, and wherein the mounting step mounts each mounting element between a respective hole of the mounting hole pattern and a respective mounting location of the pattern of mounting locations.

* * * * *